United States Patent [19]

D'Altroy et al.

[11] 4,430,663
[45] Feb. 7, 1984

[54] PREVENTION OF SURFACE CHANNELS IN SILICON SEMICONDUCTOR DEVICES

[75] Inventors: Frederick A. D'Altroy, Center Valley; Richard Lindner, Bethlehem, both of Pa.

[73] Assignee: Bell Telephone Laboratories, Incorporated, Murray Hill, N.J.

[21] Appl. No.: 247,519

[22] Filed: Mar. 25, 1981

[51] Int. Cl.³ ............................................. H01L 29/40
[52] U.S. Cl. .................................. 357/53; 357/52; 357/54
[58] Field of Search ............................ 357/52, 53, 54

[56] References Cited

U.S. PATENT DOCUMENTS

| | | | |
|---|---|---|---|
| 3,405,239 | 10/1968 | Loro | 357/53 |
| 3,455,020 | 7/1969 | Dawson | 357/54 |
| 3,462,657 | 8/1969 | Brown | 357/54 |
| 3,491,273 | 1/1970 | Stiegler | 357/54 |
| 3,518,494 | 6/1970 | James | 357/54 |
| 3,573,571 | 4/1971 | Brown | 357/53 X |
| 3,597,667 | 8/1971 | Horn | 357/53 |
| 3,602,782 | 8/1971 | Klein | 357/53 |
| 3,649,886 | 3/1972 | Kooi | 357/54 |
| 3,760,242 | 9/1973 | Duffy | 357/53 |
| 3,763,406 | 10/1973 | Bosselaar | 357/53 |
| 4,318,118 | 3/1982 | Hall | 357/54 |

*Primary Examiner*—Martin H. Edlow
*Attorney, Agent, or Firm*—H. W. Lockhart; Arthur J. Torsiglieri

[57] ABSTRACT

In planar silicon semiconductor devices of the PN junction type, field plates overlie the silicon dioxide-silicon nitride film on the device surface to inhibit inversion formation of conductive channels on the device surface. The field plates are connected to a more heavily doped zone on one side of a PN junction and extend some distance over the lightly doped zone on the other side of the PN junction.

At high reverse biases, the presence of trapping centers produces a charge level at the device surface, resulting in current channeling which produces excessive reverse leakage current. This effect is avoided or reduced by omitting the silicon nitride layer in a portion overlying the more lightly doped zone and spaced away from the PN junction boundary. This omission eliminates a portion of the oxide-nitride interface which appears to be the locus of such trapping centers.

6 Claims, 2 Drawing Figures

PREVENTION OF SURFACE CHANNELS IN SILICON SEMICONDUCTOR DEVICES

BACKGROUND OF THE INVENTION

This invention relates to planar silicon semiconductor devices, particularly of the bipolar type, which operate at relatively high voltages and include field plates to inhibit surface inversion. Planar devices are described as having a plurality of PN junction boundaries intersecting a common major surface of the semiconductor body.

It is now a well-known procedure to passivate the surface of silicon semiconductor devices by applying a dual dielectric layer to the active surface of the device. Typically, this dielectric layer consists of a first layer of silicon oxide, usually grown on the silicon surface, overlaid by a deposited layer of silicon nitride. The genetic oxide is provided primarily to stabilize the device surfaces electrically, while the layer of silicon nitride provides a barrier against certain persistent active ions, in particular sodium.

In devices in which the potential between conductivity type zones exceeds more than a few volts, typically more than about 50 volts, measures are taken to inhibit the formation of conduction channels at or near the device surface. Such channels give rise to voltage breakdown and to leakage currents. Field plates are provided in such devices to inhibit accumulation of charge and consequent inversion of the conductivity type at or near the surface of the device. A field plate typically comprises a conductive film formed on top of the dielectric layer, overlying at least a portion of the more lightly doped conductivity type zone for some distance on one side of a PN junction, and is conductively connected to a more heavily doped zone in the body.

The formation of the channels is believed explainable as follows. When a high reverse bias is applied to a PN junction, which may be an N+P or a P+N junction, under a field plate, minority carriers are injected from the more heavily doped zone to the more lightly doped zone. Ordinarily, no problem arises unless trapping centers are present in the dielectric layer, in which case conductive channels can be formed across the lightly doped zone. This results in undesirably high reverse leakage currents. The silicon dioxide-silicon nitride interface and the silicon nitride layer itself usually contain such trapping centers, particularly when sodium is present.

Thus, it is an object of this invention to avoid the formation of conductive channels under the circumstances described above.

SUMMARY OF THE INVENTION

In accordance with a particular embodiment of the invention, in a PN junction semiconductor device comprising a planar silicon body passivated by a dual dielectric layer of silicon oxide and silicon nitride and including at least one field plate on the dielectric layer overlying a PN junction boundary defined between a P type zone and a relatively lightly doped N type zone, the formation of channels is inhibited by omitting the silicon nitride layer from an annular strip underlying the field plate, spaced away from the PN junction boundary, and overlying the more lightly doped N type zone. By omitting a portion of the silicon nitride layer, a gap is produced in which no trapping centers are present, and therefore channels are not formed across the N type zone.

In another specific embodiment, a pair of field plates are used on a multi-region device of the gate-controlled type. Each field plate overlies a different PN junction and a different portion of a lightly doped N type zone. Each field plate makes conductive contact with a more heavily doped zone. Then, in accordance with this invention, two annular strips in the silicon nitride layer are produced, one under one field plate, spaced away from the outer PN junction, and the other under the other field plate, spaced away from the inner PN junction. Both gaps overlie the same lightly doped conductivity type region.

The above-described embodiments have annular configurations; that is, the conductivity type zones are nested one within another, and the electrodes to the surrounding zones are annular in shape. The invention, however, may be applied as well to devices having linear geometries and which include field plates by providing the gap in the silicon nitride layer at a location over the more lightly doped zone and spaced away from the PN junction boundary.

The fabrication of the structure described requires simply the alteration of the second window mask which defines the patterning of the silicon nitride layer. The outline of the annular strips is added to the original pattern of the mask. The device then is etched in hot phosphoric acid for a short period sufficient to remove the exposed silicon nitride. Thus, the provision of this channel-inhibiting feature requires only a slight departure from standard device fabrication procedure.

BRIEF DESCRIPTION OF THE DRAWING

The invention and its other objects and features will be more clearly understood from the following detailed description taken in conjunction with the drawing in which.

DETAILED DESCRIPTION

Figure 1:
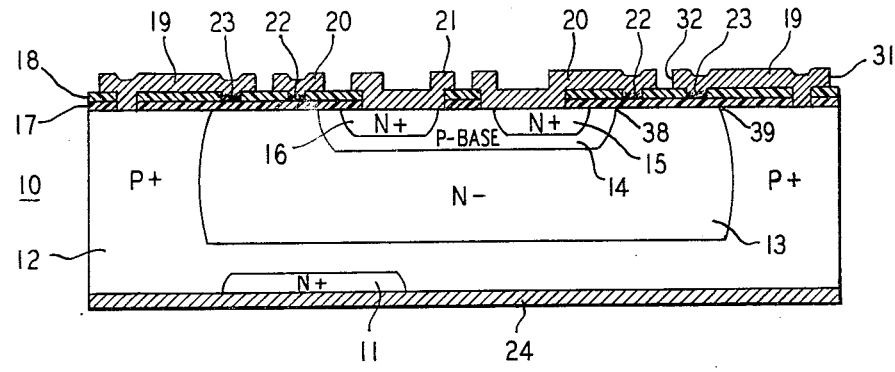
FIG. 1 is a cross-section view of a five-region silicon semiconductor device incorporating an embodiment in accordance with the invention.

The device shown in the drawing is illustrative of a class of gate-controlled semiconductor devices, usually operated at relatively high voltage levels, in excess of about 50 volts. The particular device shown is referred to as a triac and comprises basically five zones of alternating conductivity type. The chip 10 comprises a planar silicon semiconductor body having a relatively heavily doped P type zone 12, a relatively lightly doped intermediate zone 13 of N type conductivity, and a lightly doped P type base zone 14. Typically, the concentration levels for the lightly doped zones are about $10^{14}$ to $10^{15}$ atoms/cc and for the heavily doped zones about $10^{18}$ to $10^{19}$ atoms/cc. Formed within the P type base zone 14 are the relatively heavily doped N type emitter zones 15 and 16. A relatively heavily doped N type zone 11 is formed within a portion of the P type zone 12 adjoining the back surface of the chip 10. The N type zones 15, 16, and 11 typically have an impurity concentration of about $10^{19}$ atoms/cc. Contact to the back surface is provided by the metal film electrode 24.

The top major surface of the chip 10, which is the surface upon which the metallic interconnection pattern is formed, is covered, except for electrode connections, by a dual dielectric layer. This layer comprises a first layer 17 of silicon dioxide, which is formed directly on the silicon surface. Advantageously, this silicon dioxide layer 17 is produced as a genetic film by thermal growth and has a thickness of about 8000 or more Angstrom units. As is well known, such a film has the capability of stabilizing the semiconductor surface. Overlying the silicon dioxide layer 17 is a second layer 18 of silicon nitride. This layer is deposited, usually by the pyrolytic decomposition of suitable reactive compounds or by the direct deposition of nitride by thermal means and has a thickness of up to several thousand Angstrom units. In a specific embodiment, the silicon nitride layer has a thickness of 2000 Angstrom units. This construction for providing passivation and protection on semiconductor device surfaces is well known.

Figure 2:
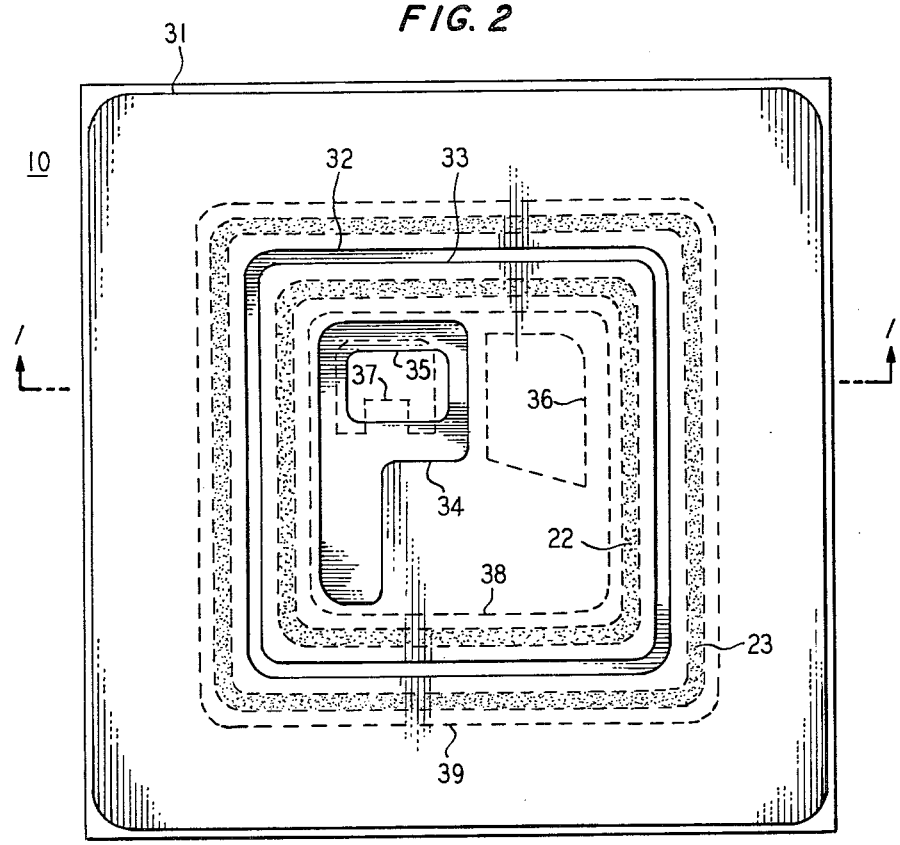
FIG. 2 is a plan view of the device of FIG. 1.

Finally, a conductive film having portions 19, 20, and 21 is formed to make contact to certain portions of the semiconductor surface and to act as a field plate over certain portions of the dielectric layer. In particular, the portion 19, which is an outermost annular film as defined between the lines 31 and 32 in the plan view of FIG. 2, constitutes a field plate overlying the PN junction boundary 39. This conductive film 19 is in conductive contact with the P type zone 12.

The film portion 20 comprises a second field plate overlying the PN junction boundary 38 and is a main terminal which makes conductive contact to both the emitter zone 15 and the P type base zone 14. This field plate 20 is defined between the lines 33 and 34 in the plan view of FIG. 2. Finally, film portion 21 is a gate terminal and makes conductive contact to the N type zone 16, as well as to the P type base zone 14. The conductive film may be of metal or other conductive material, such as polysilicon.

As shown particularly in FIG. 1, in accordance with this invention, the silicon nitride layer is omitted in the annular strips 22 and 23, which then are replaced by portions of the conductive film. The strips 22 and 23 from which the nitride has been omitted are shown stippled in both FIGS. 1 and 2. The annular strips 22 and 23, from which the nitride is omitted are beneath a field plate, overlie the lightly doped N type zone 13, and are spaced away from the boundary of the outer PN junction 39 in the case of strip 23 and the inner PN junction 38 in the case of strip 22. Typically, the strips 22 and 23 have a width of the order of 1 mil or less. By omitting these two strips of silicon nitride, the presence of electron trapping centers along an interface overlying the N type zone 13 is positively interrupted. Omission of the silicon nitride layer eliminates the interface which has been found to provide such trapping centers which lend themselves to the formation of conductive channels across the lightly doped N type zone 13. The presence of such zones in effect vitiates the effectiveness of the overlying field plates. It is significant that the field plates in turn are conductively connected to conductivity-type zones which are more heavily doped.

Fabrication of devices utilizing this invention are relatively straightforward and require simply the addition to the mask which defines the electrode windows of the pattern of the annular strips 22 and 23. Application of a suitable selective etchant such as hot phosphoric acid or the use of various dry etching procedures selectively removes the nitride from the unmasked portions.

What is claimed is:

1. A semiconductive device comprising a silicon body having a substantially planar major surface which is intersected by at least one PN junction separating two surface zones of the body of opposite conductivity type, a dielectric film over the portion of said planar surface which includes the PN junction and the portions of the two zones contiguous to the PN junction, the dielectric film comprising a continuous layer of silicon dioxide overlying and contiguous to the planar surface and a layer of silicon nitride overlying and contiguous to the silicon dioxide layer, the silicon nitride layer being segmented to provide an intermediate region spaced from the PN junction boundary where the silicon oxide is free of overlying silicon nitride, and field electrode means comprising a conductive film overlying and contiguous with the silicon nitride layer and the portion of the silicon oxide layer free of overlying silicon nitride.

2. A semiconductor device in accordance with claim 1 in which said intermediate region is an annular strip, dividing the silicon nitride into two separate sections.

3. A semiconductor device in accordance with claim 2 in which said intermediate region overlies the more lightly doped one of the two zones forming the PN junction.

4. A semiconductive device in accordance with claim 3 in which said more lightly doped zone is N type.

5. A semiconductive device in accordance with claim 3 in which the conductive film is in low resistance electrical connection to the more heavily doped one of the two zones forming the PN junction.

6. A semiconductive device in accordance with claim 5 in which said more heavily doped zone is P-type.

* * * * *